United States Patent [19]

Cohen et al.

[11] 4,182,023

[45] Jan. 8, 1980

[54] PROCESS FOR MINIMUM OVERLAP SILICON GATE DEVICES

[75] Inventors: Jerome Cohen, Centerville, Ohio; Peter C. Chen, Sunnyvale, Calif.

[73] Assignee: NCR Corporation, Dayton, Ohio

[21] Appl. No.: 844,325

[22] Filed: Oct. 21, 1977

[51] Int. Cl.² .............................................. B01J 17/00
[52] U.S. Cl. ........................................ 29/571; 29/578; 29/579
[58] Field of Search .......................... 29/571, 578, 579

[56] References Cited

U.S. PATENT DOCUMENTS

| | | | |
|---|---|---|---|
| 3,745,647 | 7/1973 | Boleky | 29/571 |
| 3,837,071 | 9/1974 | Ronen | 29/571 |
| 3,908,262 | 9/1975 | Stein | 29/579 |
| 3,958,323 | 5/1976 | De La Moneda | 29/571 |

*Primary Examiner*—W. C. Tupman
*Attorney, Agent, or Firm*—J. T. Cavender; Philip A. Dalton

[57] ABSTRACT

A method of manufacturing a silicon gate MIS device providing automatic formation and alignment of the gate structure during formation of adjacent impurity regions. In a preferred embodiment, the process is for the gate structure and source and drain of silicon gate FETs. The layered gate constituents—typically oxide and silicon—are formed on a semiconductor wafer. A photoresist mask which is larger than the desired gate size is formed on the silicon and the silicon is etched to a predetermined size beneath the overhanging mask. A deposition mask in the form of the photoresist mask or the gate silicon oxide and which is of the same size as the photoresist mask, is used to control the deposition of impurities within predetermined surface areas of the substrate which are spaced a predetermined distance from the silicon gate boundaries. By diffusion, the impurities are driven into the substrate to the desired depth to complete the source and drain, which are thereby driven laterally into coincidence with the gate boundaries. The aligned, non-overlapping relationship of the gate structure with the source and drain minimizes gate overlap capacitance.

33 Claims, 6 Drawing Figures

STEP 10A'

COMBINED DEPOSITION & DRIVE-IN

STEP 1
DEPOSIT SILICON NITRIDE LAYER

STEP 2
FORM ACTIVE AREA-DEFINING NITRIDE LAYER

STEP 3
FORM FIELD OXIDE

STEP 4
REMOVE SILICON NITRIDE

STEP 5
FORM OXIDE LAYER

STEP 6
FORM POLYSILICON LAYER

STEP 7
FORM PR MASK

FIG. 3

STEP 10A'

COMBINED DEPOSITION & DRIVE-IN 4,182,023

PROCESS FOR MINIMUM OVERLAP SILICON GATE DEVICES

BACKGROUND OF THE INVENTION

The invention relates to field effect devices and to silicon gate field effect devices. More particularly, the invention is directed to a process for forming a self-aligned, silicon-gate field effect device having minimum gate overlap capacitance.

A field effect transistor is a three electrode electronic device formed in semiconductor material such as a silicon wafer. The three electrodes are the source, gate and drain. The source and drain are formed in the silicon wafer, which is of predetermined, n or p, conductivity type by doping source and drain regions with impurities of the opposite conductivity type, i.e., p or n.

In the insulated gate field effect transistor (IGFET) technology widely used in the microelectronics industry, an insulating layer of material such as silicon dioxide (or insulating layers such as silicon dioxide and silicon nitride), the "gate insulator", is formed over the channel region between the source and drain, and the gate electrode is formed over the gate insulator. Application of suitable voltages to the gate, drain and source effect and/or control current flow from the source to the drain.

In a depletion mode transistor, a channel of he same polarity as the source and drain exists even without application of a gate voltage, i.e., for a gate voltage of zero. Conduction is normally at a maximum at zero gate voltage and is decreased or turned off by application of a suitable gate voltage. In contrast, enhancement mode transistors are normally off when the gate voltage is zero. When a suitable gate voltage is applied, the channel is inverted to the same conductivity type as the source and drain, thus providing a conduction path between the source and drain such that application of a suitable voltage to the drain causes current to flow from the source to the drain through the channel.

The small size of field effect transistors presents numerous problems, such as imprecise alignment of the gate structure with respect to the source and drain. Imprecise alignment results in excessive overlap of the gate structure relative to the source and drain and in parasitic capacitance. The speed of operation decreases with increases in the total capacitance between the gate and the substrate. Thus, the addition of parasitic capacitance decreases the speed of operation of the insulated gate field effect device. Furthermore, the thrust of the art of large scale integrated circuits is to shrink the sizes of silicon gate FETs in order to increase both the density of the circuits and the speed of operation of the FET devices. As the channel lengths are shortened the parasitic capacitance due to overlap of gate electrode and source and drain regions becomes an increasingly significant factor in the speed of device operation and thus a limiting factor in increasing the speed of device operation.

U.S. Pat. No. 3,475,234 issued Oct. 28, 1969 to Kerwin et al. and U.S. Pat. No. 3,544,399 issued Dec. 1, 1970 to Dill, are directed to self-aligned silicon gate devices which presumably have reduced overlap. In the self-alignment process described in these patents, the gate insulator is first formed over the channel region, then a layer of silicon (typically polycrystalline silicon) is formed over the wafer. Apertures are formed in the silicon-insulator structure and source-and drain-forming impurities are deposited in the substrate through the apertures. The silicon (1) acts as a mask during the deposition step and prevents doping of the channel region during formation of the source and drain and (2) is itself doped, becoming a conductor suitable for use as the gate electrode. Since the silicon gate electrode is in situ during the formation of the source and drain, the source and drain are formed relatively precisely at the edges of the gate structure, at least in comparison to the alignment attainable with typical metal gate processes. This is because metal gates, usually aluminum, present degradation problems at the temperatures required for diffision. Thus, the metal gate cannot be used as a mask during the formation of the source and drain, but must be formed subsequently in the fabrication process, with the concomitant problems of imprecise alignment.

U.S. Pat. No. 3,921,282 issud Nov. 25, 1975 to Cunningham et al. also uses the gate structure to mask the channel region. The Cunningham et al. process differs from those of Kerwin et al. and Dill in that the silicon gate electrode is formed after the source and drain regions and the field oxide are formed. Silicon oxide is formed over layers of oxide and nitride which cover the channel region and is used as the mask during formation of the source and drain. A thick layer of oxide is then formed on the wafer. The nitride is used as an oxidation barrier during this step, to prevent oxidation of the channel region. The result is a channel region well which is surrounded by the thick oxide layer. The nitride is then removed and the gate electrode can then be deposited over the channel-covering oxide with relatively few alignment problems, for the well precisely defines the channel region between the source and drain, while the thick surrounding oxide reduces the effect if the silicon overlaps the source or drain.

The more precise alignments provided by the above silicon gate processes do not eliminate gate overlap capacitance, however. This is because diffusion is an isotropic process and in diffusing the impurities into the substrate to form the source and the drain, the impurities also diffuse laterally and tuck under the gate. The resulting overlap between the source and drain and the gate structure, of course, results in gate overlap capacitance.

As will be appreciated from the above, it is desirable to have a process for forming semiconductor devices which precisely aligns the gate structure with respect to source and drain regions, without overlap.

SUMMARY OF THE INVENTION

The invention is an improvement of the self-aligned silicon gate process disclosed in Kerwin et al., U.S. Pat. No. 3,475,234, and Dill, U.S. Pat. No. 3,544,399, and is a process for simultaneously forming and aligning a silicon electrode coincident with an adjacent impurity region in a stratified structure comprising a semiconductor substrate and a layer of silicon. The process comprises forming on the silicon a masking layer providing a masked region having a first boundary; forming from the silicon layer the silicon electrode having a second boundary spaced along the substrate from the first boundary; and doping the substrate to form the impurity region with an attendant boundary controlled by the first boundary and coincident with the second boundary.

DETAILED DESCRIPTION

Figures 1, 4:
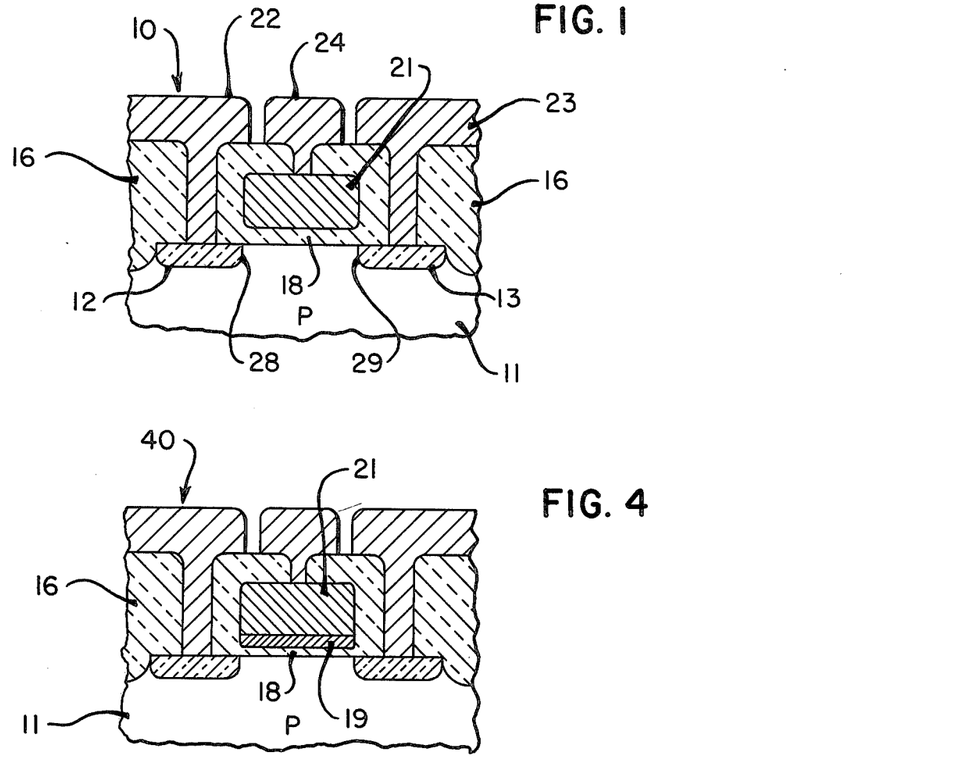
FIG. 1 is a cross-sectional view, taken parallel to the channel, of an insulated, self-aligned, non-overlapping silicon gate field effect transistor fabricated according to a process embodying the principles of the present invention.
FIG. 4 is a cross-sectional view in the manner of FIG. 1 of another transistor device fabricated according to an alternative process embodying the principles of the present invention.

Referring now to FIG. 1, there is shown a cross-sectional view taken parallel to the channel of a self-aligned silicon gate field effect transistor 10 embodying the principles of the present invention. Although the description is directed to the fabrication of the transistor 10, the description is exemplary of the fabrication of a class of devices which embodies the principles of the present invention. Also, the process parameters are exemplary of alternatives which will be readily applied by those skilled in the art to implement the disclosed process.

The device 10 comprises a substrate 11 of one conductivity type, illustratively, P-type, within which spaced-apart surface-adjacent regions of the opposite conductivity type form source 12 and drain 13. A thick layer 16 of dielectric, typically silicon oxide, is formed on the substrate 11 for isolating the device 10. A gate structure comprising silicon oxide gate insulation layer 18 and silicon gate electrode 21 overlies the channel region between the source 12 and drain 13. The gate structure is directly above and the opposite edges thereof are coincident with the source and drain inner edges 28 and 29 (the opposed inner edges of the junctions of the source and drain with the substrate), yet does not significantly overlap the source and drain. For purposes of illustration, electrical contacts 22 and 23, respectively, are shown connected to the source 12 and the drain 13 for applying bias voltages which, in cooperation with the gate voltage applied via electrical contact 24, control the conduction path and current across the channel region. Those skilled in the art will understand that electrical contact is usually made at a single point along each of a pair of diffusion stripes which provide the source and drain for a plurality of devices. Other insulating materials, passivating materials, and electrical connections and interconnections (not shown) may be applied as needed to complete the protection of and the integration of the transistor 10 with other components.

The thicknesses and other dimensions shown for device 10 are selected for clarity of illustration and are not to scale. Typical thicknesses, dictated by the current state of the art, are: source 12 and drain 13 junction depth, about 2-2.5 microns for p-channel and one micron for n-channel; field oxide 16, about 1.5-2.0 microns; gate oxide 18, about 0.1 micron (1,000 Angstroms); silicon gate electrode 21, about 0.5 micron; source and drain contacts 22 and 23, about 4 microns; and gate contact 24, about 4 microns. Also, the gate structure length (measured along the longitudinal dimension of the channel between the source and drain parallel to the plane of the drawing) and width (measured laterally of the channel length perpendicular to the plane of the drawing) are typically approximately 3 microns by 10 microns but could be made smaller or larger. At least some of these dimensions, such as junction depth, can be expected to decrease with improvements in process technology. In any event, it is obvious that meaningful scale representation of such widely varying dimensions is impossible within relatively small drawing space.

The present fabrication process provides a self-aligned structure in which the process of forming the source 12 and drain 13 automatically forms the gate structure and forms the source and drain in precisely aligned, non-overlapping relationship with respect to the gate structure.

Figure 2A:
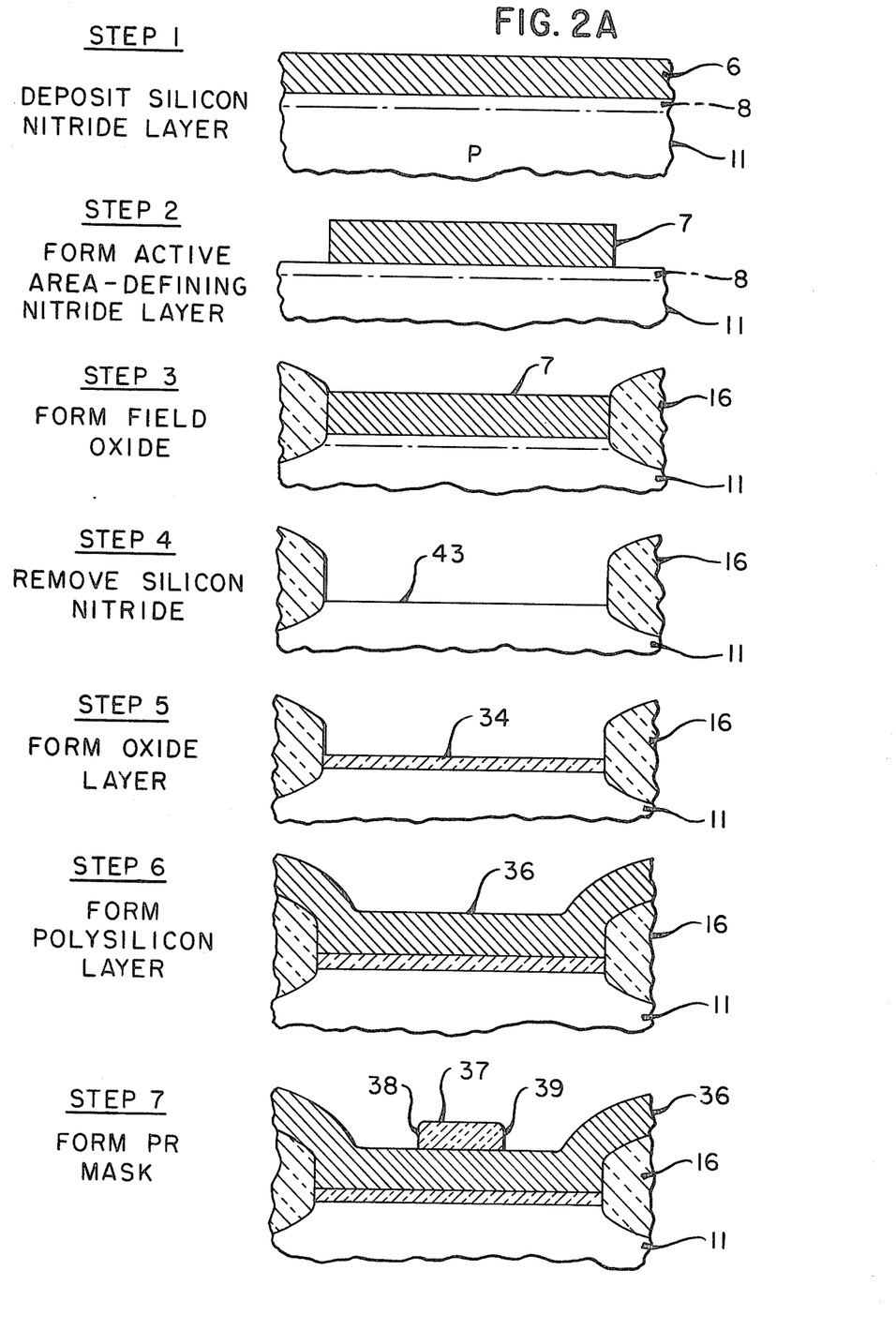
FIGS. 2A and 2B comprise a flow diagram illustrating by sequential cross-sectional representation the process of the present invention for forming an insulated, self-aligned, non-overlapping silicon gate semiconductor device.
Figure 2B:
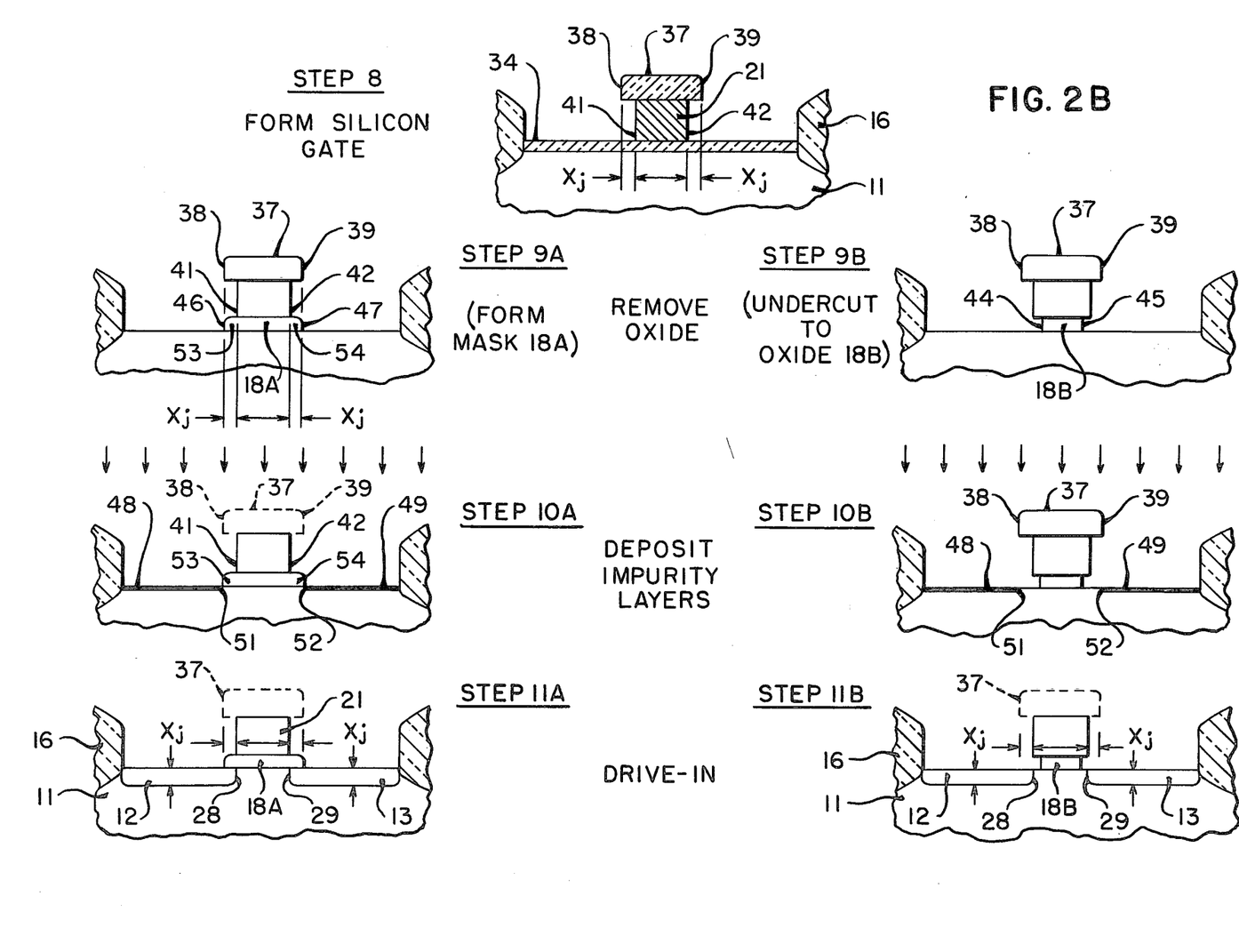

Referring to FIG. 2, the exemplary process comprises: forming a layer of silicon nitride 6 on a semiconductor wafer 11 (step 1); selectively removing th silicon nitride layer to leave a layer 7 of active device area-defining silicon nitride which is approximately coextensive longitudinally and laterally of the substrate with the subsequent location and shape of the combined source, gate and drain (step 2); forming a thick oxide layer 16 on the substrate 11 about the sides of the nitride layer 7 (step 3) removing the silicon nitride layer 7 to leave the active device area 43 defined on the substrate by the oxide layer 16 (step 4); forming an oxide layer 34 in the channel area (step 5); forming a silicon layer 36 on the oxide layer 34 (step 6); forming a photoresist mask 37 over and extending longitudinally outside the gate region (step 7); overetching the silicon layer 36 under the mask 37 to form silicon gate electrode 21 having opposite edges 41 and 42 lying inside the opposite edges 38 and 39 of the mask (step 8); and, selectively forming the oxide layer 34 to the desired shape of the gate oxide 18 (step 9).

In one embodiment, the process next uses separate deposition and drive-in steps to form the source and drain. First, layers 48 and 49 of impurities are deposited in the channel region of the substrate using the mask 37 (step 10B; deposition may be by ion implantation) or the gate oxide 18A (step 10A; deposition may be by diffusion of impurities or ion implantation) as a deposition mask to form the impurity layers with edges 51 and 52 spaced a predetermined distance outside the gate electrode 21. Then, the impurities are driven into the substrate by high temperature diffusion for a time sufficient to attain the desired junction depth, $x_j$, and align the impurity layer edges 51 and 52 with the opposite edges 41 and 42 of the silicon gate (step 11), thus completing the source and drain.

The two step, diffusion deposition - diffusion drive-in approach is particularly useful where the device is subjected to subsequent high temperature processing steps. This is because the two step approach permits depositing the impurity layers 48 and 49 to an initial, predetermined junction depth and to initial, predetermined lateral edges 51 and 52 such that the particular subsequent high temperature process step(s) (whether used for other fabrication steps or used solely for drive-in purposes) will drive the impurities into the substrate and laterally along the substrate to complete the source and drain at the desired junction depth and with inner edges 28 and 29 thereof coincident with the gate.

Figure 3:
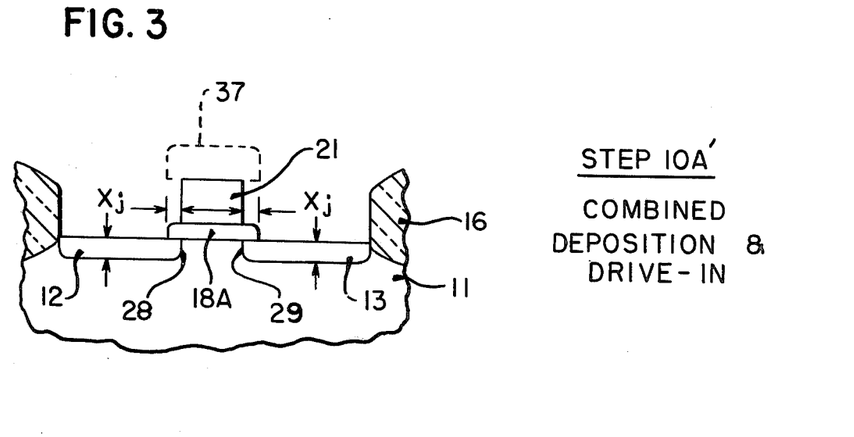
FIG. 3 shows a single step alternative to the two step deposition and drive-in sequence of FIG. 2B.

As an alternative to the two-step, deposition and drive-in sequence, and referring to FIG. 3, step 10A', formation of the source and drain can be done using a high temperature diffusion cycle to accomplish deposition and drive-in in a single process step. That is, using high temperature diffusion the impurities are deposited and driven into the substrate for a time sufficient to form the source and drain to the desired junction depth $x_j$ and with the inner edges 28 and 29 thereof coincident with the gate opposite edges 41 and 42.

Referring further to FIG. 2A and focusing upon the results of the crucial steps of the process, a photoresist mask 37 is formed on the previously formed silicon (step 7). The peripheral boundary or boundary of the mask 37 includes opposite longitudinal edges 38 and 39 which extend the distance equal to the junction depth $x_j$ (the depth in the substrate of the source-substrate junction and the drain-substrate junction) past the opposite longitudinal edges 41 and 42 of the peripheral boundary or boundary of the subsequently formed gate electrode 21. Referring to FIG. 2B, the electrode 21 is then formed by undercutting the silicon layer 36 beneath the mask 37 (step 8). Next, the mask 37 is used to form oxide layer 34 to (1) a gate oxide 18A having a peripheral boundary or boundary of which opposite longitudinal edges 46 and 47 are aligned with the mask edges (step 9A) or (2) a gate oxide 18B having a peripheral boundary or boundary of which opposite longitudinal edges 44 and 45 are recessed beneath the mask (step 9B). As mentioned, the alternative oxide dimensions permit the use of (1) either diffusion or ion implantation (step 10A) or (2) ion implantation (step 10B) to form impurity regions 48 and 49 having inner edges 51 and 52 which are controlled by the mask edges 38 and 39 or the oxide edges 46 and 47 (step 9). In either case, the inner edges 51 and 52 of the boundaries of the impurity regions are initially spaced longitudinally approximately the distance $x_j$ from the silicon gate edges. Upon heating the substrate 11 (step 11A or 11B) to diffuse the impurities into the substrate and form the source and drain of junction depth $x_j$, lateral diffusion also occurs and the impurities are also driven laterally the distance $x_j$ from impurity layer inner edges 51 and 52 and into coincidence with the edges 41 and 42 of the gate. That is, source 12 and drain 13 are completed so that inner edges 28 and 29 of their boundaries are aligned with the gate edges 41 and 42.

The preceding discussion regarding steps 10 and 11 applies also to the alternative, one step, diffusion cycle shown in FIG. 3, step 10A', except that the diffusion cycle by which ions are deposited is continued, as required, to expand the initial impurity layers 48 and 49 to the desired dimensions of the source and drain. Again, the inner edges of the source and drain boundaries are aligned with the gate edges 41 and 42.

Referring further to FIG. 2, preparatory to the crucial oxide removal, impurity deposition, or impurity deposition and drive steps, in step 1 the silicon nitride layer 6 is formed on the substrate 11 to a thickness, e.g., of 1,500 Angstroms. Exemplary techniques for forming the layer 6 include reacting ammonia, $NH_3$, and silane (silicane) $SiH_4$, in a reactor at approximately 800° C., or reacting ammonia and silicon tetrachloride, $SiCl_4$, in a furnace at approximately 900° C. Those skilled in the art will appreciate that the parameters such as temperature and thickness may be changed, and other processes employed, for this and the other steps.

It may be desirable to grow a layer 8 of oxide (shown in phantom in FIG. 2A, step 1) on the substrate 11 to increase adhesion of the silicon nitride layer 6 to substrate materials such as silicon. The oxide layer 8 also acts as a barrier to prevent the formation of hard-to-etch compounds by the silicon nitride 6 and the silicon substrate 11. A thickness of about 1,000 Angstroms is suitable for the layer 8. One suitable technique is to steam grow the silicon oxide layer 8 at 975° C. Other techniques such as pyrolitic decomposition and plasma deposition will be readily applied by those skilled in the art.

In step 2, the nitride layer 6 is formed to the active device area-defining layer 7. One technique is to etch the layer 6 through a mask (not shown). The mask can be a standard photoresist material such as Waycoat which is applied in solution to the nitride, spun to promote a uniform coating, and then dried. The resulting layer is exposed to ultraviolet light through a mask (not shown), developed in Waycoat developer to remove the exposed areas, and the developed image hardened by baking. The non-developed areas are then removed, then the resulting exposed nitride areas are removed by etching in hot phosphoric acid.

In step 3, the field oxide 16 is grown about the edges of the channel nitride layer 7 and to a thickness of about 1.5 microns (15,000 Angstroms). As is done in growing oxide layer 8, the field oxide can be steam grown at 975° C.

In step 4, the channel-defining nitride layer 7 is removed by etching in hot phosphoric acid. If the adherence-promoting oxide layer 8 is present, it is also removed, e.g., by etching using an etchant such as a 7:1 mixture by volume of ammonium fluoride and hydrofluoric acid. This mixture etches silicon oxide at about 1500 Angstroms per minute at 33° C. and, at this temperature, will etch through the 1,000 Angstrom thickness of silicon oxide layer 8 to the substrate 11 in less than one minute. Removal of the slicon nitride layer 7 or the nitride layer and the oxide layer 8 leaves channel region 43 defined within field oxide 16 on the surface of substrate 11.

In step 5, layer 34 of oxide is grown or deposited on the substrate 11 in the channel region 43. Growing the oxide in a dry $O_2$ environment provides a good quality, relatively dense gate oxide; however, the aforementioned steam growth, pyrolitic decomposition, or plasma deposition techniques can be used. For the exemplary dry $O_2$ growth, at 1,000° C. the oxide layer is formed to the sufficient thickness of about 0.1 micron (1,000 Angstroms) in about 150 minutes.

The silicon layer 36 is formed on the silicon oxide surface in step 6 by, e.g., decomposition of silane. One suitable method employs the AMT Model 1200 reactor made by Applied Materials, 3050 Bowers Avenue, Santa Clara, Calif., and transports the silane in nitrogen carrier gas and decomposes the silane at 600°–700° C. for deposition on the underlying silicon oxide.

At least several other techniques such as deposition in a furnace tube, evaporation, pyrolitic decomposition of e.g. $SiCl_4$ and $H_2$, and cathodic sputtering can be used to form the silicon. It should be noted that the exemplary conditions are not suitable for the formation of single crystal silicon and the silicon will be formed in polycrystalline form, but that either single crystal or polycrystalline silicon can be utilized in the electrode 21.

The gate photoresist mask 37 is formed on the silicon layer 36 in step 7. The peripheral boundary of the mask is formed so that opposite edges 38 and 39 thereof are each spaced (in their longitudinal positions along the length of the channel) the distance of the source and drain junction depth, $x_j$, from the subsequently formed (step 8) opposite edges 41 and 42 of the silicon gate electrode 21. Again, the mask may be formed as described in step 2 using suitable conventional photolithographic techniques.

In FIG. 2B, step 8, the silicon layer 36 is etched about the mask 37 to the oxide layer 34 to form gate electrode 21. Preferably, the etchant, such as a mixture of hydrofluoric, nitric and acetic acids or a plasma etcher using $CF_4$ gas, selectively etches the silicon (etches the silicon much faster than the adjacent material). The etching treatment is applied for a sufficiently long time to form the silicon gate electrode 21 to the desired peripheral boundary, including longitudinally opposite edges 41 and 42 which define gate length along the length of the channel.

In step 9, the silicon oxide layer 34 is formed to the desired peripheral boundary of gate oxide 18. Referring to 9B, the oxide layer 34 may be selectively removed in the presence of the mask 37 so that longitudinal edges 44 and 45 of the resulting gate oxide 18B are aligned with edges 38 and 39 of the mask 37 or are recessed beneath the mask. For example, a selective etchant such as the 7:1 buffered mixture of hydrofluoric acid in ammonium fluoride can be used to overetch the oxide beneath the mask to form the gate oxide 18B recessed beneath the mask.

Referring to step 9A, an alternative approach is to form gate oxide 18A with longtiudinal edges 46 and 47 coincident with the photoresist mask edges 38 and 39, i.e., spaced $x_j$ from gate edges 41 and 42. The gate oxide 18A can then be used as a deposition mask for impurity layers 48 and 49. The gate oxide 18A can be formed by selective etching of a mask-defined, ion implanted region of oxide 34 or by ion milling or field-aided plasma techniques.

The selective etching is accomplished by using ion implantation to dope the oxide layer about the mask 37 outside the gate edges 46 and 47 with p-type dopant, such as boron, to a concentration of about $10^{19} Cm^{-3}$. Then, an etchant, such as dilute hydrofluoric acid, is applied which selectively etches the doped oxide more quickly than the undoped oxide. For example, dilute hydrofluoric etchant removes oxide having a $10^{19} Cm^{-3}$ concentration of boron about 5 times faster than it removes undoped oxide. For the 1,000 Angstrom thick oxide layer 34, the hydrofluoric acid would overetch the oxide about 200 Angstroms beneath the mask.

Ion milling and field-aided plasma etching techniques are unidirectional. When applied in the presence of mask 37, these techniques form the oxide to the same shape, size, and location as the mask. Thus, a predetermined size, shape, and location can be transferred directly from the mask to the gate oxide 18A. Ion milling can be done using an ion-milling system to impinge argon ions normal to the oxide surface to eject atoms from the surface and thereby remove the surface. One suitable system is a Veeco Micro Etch used with a VS 7760 pumping station, both available from Veeco Instruments, Inc., Terminal Drive, Plainview, New York. Field-aided plasma etching can be employed by applying an electric field normal to the surface to be etched to selectively direct the plasma ions of a $CF_4$ gas plasma in a commercial plasma etcher. One suitable etcher is model no. PFS/PDE/PDS-501 available from LFE Corporation, 1601 Trapelo Road, Waltham, Mass.

In FIG. 2B, step 10, the mask 37 and/or the gate oxide 18 are used as deposition masks to define the impurity layers 48 and 49. As mentioned previously, the impurity layers 48 and 49 can be implanted or diffused. Implantation is more nearly unidirectional than is diffusion and implanted areas are thus more precisely defined by the mask outline. That is, by positioning the bombardment system to direct the ions perpendicularly to the mask 37, the mask defines the inner edges 51 and 52 of the impurity layers approximately coincident with mask edges 38 and 39. This is true although the mask 37 is spaced from the substrate surface. The mask 37 thus may be used with implanation in both step 10A and step 10B.

The oxide 18A of step 9A is suitable for use as a deposition mask during diffusion as well as during implantation in step 10A. This is because the extension 53 and 54 of gate oxide 18A provide a mask on the substrate which precisely defines the edges 51 and 52 of the deposited layers, regardless of which deposition process is used.

Those skilled in the art will realize it may be desirable to implant impurities through an oxide layer to minimize substrate surface crystal lattice damage. This can be done by forming the layer of oxide outside gate oxide region 18A or 18B prior to implantation. Alternatively, some or all of the thickness of the portions of oxide layer 34 outside oxide 18A or 18B may be left in place by an abbreviated step 9 or by eliminating step 9.

Referring to FIG. 3, step 10A', the invention also extends to the use of either mask 37 or gate oxide 18A with the one step diffusion cycle. As is true for ion implantation per FIG. 2B, step 10B, or ion implantation or diffusion per step 10A, the deposition mask defines the inner edges 51 and 52 of the deposited impurity layers. For a short diffusion deposition time, edges 51 and 52 will be approximately coincident with the deposition mask edges. Most of the drive-in and lateral drive-in will be performed during the subsequent drive-in cycle. This is the situation represented by FIG. 2, steps 10A and 11A. For longer diffusion deposition cycles, edges 51 and 52 still will be controlled by the mask edges, but will be increasingly close to outer edges 41 and 42 of the gate. At the opposite extreme from step 10A, the diffusion deposition cycle is continued for a sufficient time to drive-in the impurity layers to junction depth $x_j$ and to laterally drive the edges 51 and 52 the distance $x_j$ into coincidence with the gate edges. That is, the diffusion deposition cycle is used to form the source and drain so that inner edges 28 and 29 are coincident with gate edges 41 and 42. This is the situation shown in FIG. 3, step 10A'. Numerous two-step diffusion deposition and diffusion drive-in cycles are possible between the extremes of step 10A and step 10'. Also, the length of the deposition and/or the drive-in will be varied to suit the desired junction depth and the individual fabrication process, including any subsequent high temperature process steps.

As an example of the application of steps 10 and 11, for diffusion, phosphorus-doped impurity layers can be formed in the substrate pursuant to step 10A, FIG. 2B or step 10A', FIG. 3 by subjecting a POCl$_3$ compound source to about 900° C. If it is desired to drive-in the resulting layer, the substrate is heated, e.g., to about 1000° C. pursuant to step 11A to drive the impurity layers isotropically into the substrate to complete the N-type source and N-type drain.

Because drive-in is approximately isotropic, in steps 10A', 11A and 11B, the ions diffuse laterally (orthogonally relative to the perpendicular drive-in direction) along the substrate a like distance, i.e., about $x_j$. This characteristic is utilized, by depositing the impurity layers through substrate surface regions having inner edges which are spaced the distance $x_j$ from their respective nearest gate electrode edges 41 and 42 (step 10). Then, when the deposited layers are diffused into the substrate to the junction depth $x_j$ in step 11, diffusion also drives inner edges of the layers laterally (including longitudinally along the channel) the distance $x_j$ to form source 12 and drain 13 having their inner edges 28 and 29 aligned with the respective adjacent edges 41 and 42 of the gate electrode 21.

About 500–1,500 Angstroms thickness of oxide (not shown) may be formed on the polysilicon layer 36 after step 6 to enhance adhesion between the photoresist mask 37 and the polysilicon. The oxide outside the mask can then be removed after step 7 using the 7:1 buffered mixture of hydrofluoric acid in ammonium fluoride. Finally, the remaining oxide under the mask would be removed at the same time as, as the next process step following, removal of the mask.

The device 10 is typically completed to the form shown in FIG. 1 by forming additional insulation, as needed, over the source 12 and drain 13 and etching openings through the insulation and forming the illustrative source, drain, and gate contacts 22, 23, and J4. Although the gate silicon electrode 21 is made conductive by the doping of step 10, an additional conducting layer of material (not shown) may be applied to the electrode to enhance electrical contact. (This doping may also convert the surfaces of oxide extensions 53 and 54 into unwanted conductors which connect the gate to the source and drain. To eliminate this condition, the doped surfaces of the extensions can be removed after step 10 or step 11.) The contacts 22, 23, and 24 are typically of a conducting metal such as aluminum. A passivating layer (not shown) of material such as silicon oxide and connections and interconnections (not shown) may also be applied to the device. Also, the gate and/or the field regions of the substrate may be doped during the fabrication process to control the threshold voltage and eliminate parasitic conduction paths. Such doping is conveniently done early in the process, prior to the introduction of obstructing structures such as the gate or the field oxide.

The invention is not limited to formation of the exemplary silicon-oxide-semiconductor structure, but applies equally to gate structures or other projections of oxide, silicon, nitride, etc. which are adjacent one or more diffused regions. For example, the polysilcion could be replaced by any refractory metal to form an MOS (metal-oxide-semiconductor) structure. Also, the SiO$_2$ could be instead a composite of Si$_3$N$_4$ SiO$_2$ or of Al$_2$O$_3$ and SiO$_2$. Furthermore, and referring to FIG. 4, a memory SNOSFET (silicon-nitride-oxide-semiconductor field effect transistor) or MNOSFET (metal-nitride-oxide-semiconductor field effect transistor) 40 having nitride layer 19 inserted between the gate oxide 18 and the gate electrode 21 may be formed using the process for the present invention. The SNOS and MNOS structures can be fabricated by forming the oxide layer 34 to about 500 Angstroms in step 5; depositing a 500 Angstroms layer of nitride on the oxide after step 5; depositing the gate conductor layer 36 per step 6; performing steps 7 and 8; then, if desired, removing the nitride outside the gate region after step 8 using a selective etchant such as phosphoric acid.

Another solution to the problem of gate overlap capacitance which employs the broad teaching of the present invention is taught in NCR Docket No. 2670, the subject of U.S. application Ser. No. 844,164 now U.S. Pat. No. 4,14,904, entitled "Method for Forming Ion-Implanted Self Aligned Gate Structure", filed in the name of Robert K. Jones on the same date and assigned to the same assignee as the present application. The Jones application uses scattering during ion implantation preferably of heavy ions, to effect deposition (step 10) and drive-in (step 11) simultaneously and, if desired, without removing portions of the gate oxide layer 34 (step 9).

Figure 5:
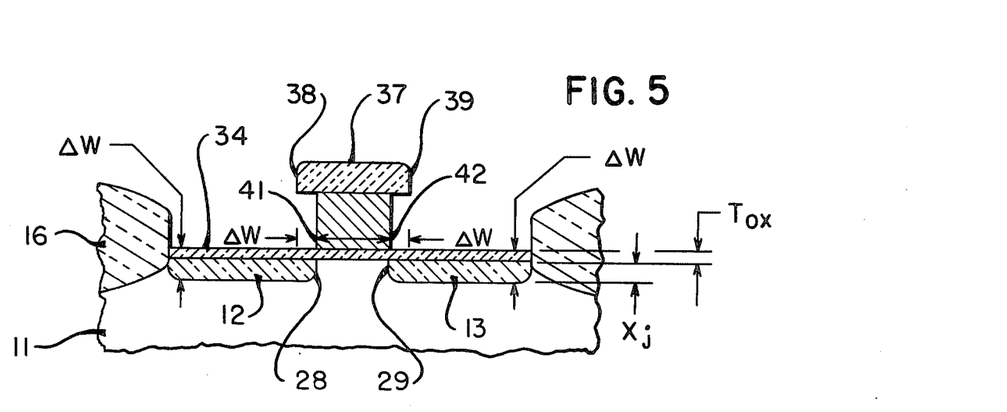
FIG. 5 is a cross-sectional view of an insulated, self-aligned, non-overlapping silicon gate field effect transistor at an intermediate stage of the fabrication process taught in NCR Docket No. 2670, the subject of copending U.S. Patent Application Ser. No. 844,164 now U.S. Pat. No. 4,149,904, to Robert K. Jones, entitled "Method for Forming Ion-Implanted Self-Aligned Gate Structure".

Referring to FIG. 5, according to the Jones invention, isotropic ion scattering and the similarity of the silicon oxide 34 and silicon 11 media are used to form a source 12 and a drain 13 which are of the desired junction depth $x_j$ and are coincident with the gate edges 41 and 42.

The photoresist mask 37 is formed having a longitudinal dimension which extends the distance $\Delta w$ beyond the desired positions of the edges 41 and 42 of the silicon gate 21, where $\Delta w = T_{ox}$ (gate oxide thickness) $+ x_j$. The silicon gate 21 is then formed in the manner of step 8 by overetching, etc. of the silicon layer 36 so that edges 41 and 42 are $\Delta w$ inside the mask edges 38 and 39.

The source and drain are then implanted by accelerating ions at a suitable energy to effect scattering within the oxide and silicon. Because of the scattering, ions are driven perpendicularly into the silicon oxide layer 34 and the substrate 11, laterally along the plane of the oxide, and in all directions in between. As the result of this approximately isotropic scattering and the nearly equal velocities of the ions in silicon oxide and silicon media, upon entering the oxide layer 34 the ions will travel laterally and perpendicularly at approximately equal speeds. The ions thus traverse the distance $\Delta w$ from the mask edges 38 and 39 to the gate edges 41 and 42 in the same amount of time required to cover the distance $\Delta w$ from the surface of the oxide layer 34 to the source-substrate junction and the drain-substrate junction at the depth $x_j$ beneath the substrate surface. Thus, by scattering, the source 12 and drain 13 are formed to the desired junction depth $x_j$ and with inner edges 28 and 29 coincident with the gate edges 41 and 42.

To relate the Jones process to that of the present invention, refer to FIG. 2. The preliminary steps 1 through 6 of FIg. 2 may be used in practicing the Jones invention. The mask 37 is formed in a manner similar to that of step 7 of the present invention, with the longitudinal dimension selected to provide the desired overhang $\Delta w$ over each of the longitudinal edges 41 and 42 of the silicon gate electrode 21. The silicon gate electrode is then formed to edges 41 and 42 in accordance with step 8. The selective oxide removal of step 9 need not be used. Instead, the portions of the oxide layer 34 which are removed from outside the gate edges in step 9 of the present application remain in place. The deposition and drive-in of steps 10 and 11 are not used. Instead, ions are implanted and scattered by the oxide and silicon, as discussed above, to form the edges 28 and 29 of the source and drain coincident with the edges 41 and 42 of the gate electrode. The doped portions of oxide layer 34 are next removed, for example, by using an etchant which preferentially attacks the doped oxide. Then, oxide is formed over the source and drain, contacts are applied to the source, drain and gate, etc. to complete the device in a manner similar to the completion of device 10.

Alternatively, oxide layer 34 may be removed outside the gate electrode 21 or outside the mask 37 and the implantation effected directly into the substrate 11. In this cast $T_{ox}=0$, $\Delta w = x_j$, and, in effect, the ion implantation and diffusion of step 10B and 11B are replaced by a single ion implantation step.

In the preferred usage of heavy ions, such as arsenic and antimony, the Jones invention provides a source and a drain which are relatively immobile at high temperatures and, thus, unaffected by subsequent high temperature process steps.

The performance of the device 10 relative to that of prior art devices can be estimated as follows. First, the gate capacitance, $C_g$, is given by:

$$C_g = \epsilon A_g/d, \qquad (1)$$

where
$\epsilon$ = permittivity of the gate dielectric,
d = thickness of the gate dielectric, and
$A_g$ = gate area.
The gate area, $A_g$, is given by:

$$A_g = w(L_{eff} + 2l), \qquad (2)$$

where
w = gate width,
$L_{eff}$ = minimum effective gate length, i.e. channel length and
l = length of overlap between the gate and the source and/or drain.
Combining equations (1) and (2), $$C_g = \epsilon w(L_{eff} + 2l)/d. \qquad (3)$$

The ratio of the capacitance, $C_{gn}$ ($l=l_n$), for the inventive device 10 to that of prior art devices, $C_{go}$ ($l=l_o$), is obtained from equation (3) and, after cancelling like terms, is:

$$\frac{C_{gn}}{C_{go}} = \frac{(L_{eff} + 2l_n)}{(L_{eff} + 2l_o)}. \qquad (4)$$

Assuming that the prior art overlap $l_o$ is equal to $x_j$, which approximates both the junction depth and the lateral diffusion distance, and that the overlap, $l_n$, of device 10 is $\approx 0$, $$C_{gn} \approx \frac{L_{eff}}{L_{eff} + 2x_j} C_{go}. \qquad (5)$$

Then, for the typical values $x_j \approx 1$ micron and $L_{eff} \approx 4$ microns, $C_{gn} \approx 0.67 C_{go}$. The device 10 is thus seen to decrease gate capacitance by about one-third.

Consider next the MOS inverter delay, $t_d$, which is given by $$t_d \approx R_{on} C_g (1+M), \qquad (6)$$

where
$R_{on}$ = turn on resistance of the load device, and
M = Miller coefficient, indicating the feedback capacity of the device.

The ratio of the time delay for device 10, $t_{dn}$, to that for prior art devices, $t_{do}$, is $$\frac{t_{dn}}{t_{do}} = \frac{C_{gn}(1+M_n)}{C_{go}(1+M_o)}, \qquad (7)$$

and $$t_{dn} \approx 0.57 \, t_{do},$$

where
$M_n \approx 0$,
$X_j \approx 1$ micron
$L_{eff} \approx 4$ microns, $$M_o \approx \frac{x_j}{L_{eff} + 2x_j} \approx 0.167, \text{ and}$$

$C_{gn}/C_{go} \approx 0.67$, from (5).

In short, in typical applications the device 10 embodying the present invention can be expected to decrease gate capacitance by about one-third ($C_{gn} \approx 0.67 C_{go}$) and to decrease the operating time delay by nearly one-half ($t_{dn} \approx 0.57 \, t_{do}$).

Thus, there has been described a process for forming a self-aligned, non-overlapping silicon gate device and an exemplary embodiment for forming a silicon gate FET. Other alternative embodiments and changes in scope and detail within the scope and spirit of the invention will be readily devised by those skilled in the art. For example, the invention is applicable in general to the fabrication of projections of oxide, silicon, etc. which are adjacent one or more diffused regions. Also, fabrication parameters such as etchants and etch times and temperature will be readily changed by those skilled in the art.

Having described preferred and alternative embodiments of the invention, what is claimed is:

1. In a process using a semiconductor substrate having a layer of silicon thereon to form a semiconductor device having a silicon electrode adjacent an impurity region in the substrate, the improvement wherein the boundary of the silicon electrode is aligned with the boundary of the impurity region by the process of forming the impurity region and comprising:
   forming on the silicon layer a masking layer providing a masked region having a first boundary;
   forming from the silicon layer the silicon electrode having a second boundary spaced along the substrate from the first boundary and within the masked region; and
   doping the substrate with impurities according to a preselected doping method to form the impurity region with an attendant boundary controlled by the first boundary and aligned with the second boundary, the distance between the boundaries being prearranged to correspond to the amount of lateral movement of the impurities inherent in the preselected doping method.

2. The process of claim 1 wherein the step of doping the substrate comprises:
   forming a thin layer of impurities at the surface of the substrate to a boundary aligned with the first boundary; and heating the substrate for a sufficient time to diffuse the impurities and thereby move the impurity layer boundary into alignment with the second boundary.

3. The process of claim 1 wherein the step of doping the substrate comprises:
   implanting a thin layer of impurities at the surface of the substrate and having a boundary aligned with the first boundary; and
   heating the semiconductor for a sufficient time to diffuse the impurities and thereby move the impurity layer boundary into alignment with the second boundary.

4. The process of claim 1 wherein the semiconductor device further comprises a layer of oxide intermediate the substrate and the silicon layer and wherein after forming the silicon electrode the oxide is formed to have a boundary aligned with the first boundary.

5. The process of claim 4, wherein the oxide is formed using a plasma etchant in the presence of the masking layer to remove the portion of the oxide layer outside the first boundary.

6. The process of claim 4 wherein the oxide is formed by ion milling thereof in the presence of the masking layer to remove the portion of the oxide layer outside the first boundary.

7. The process of claim 4 wherein a thin layer of impurities is formed on the substrate by diffusion, then the substrate is heated for a sufficient time to diffuse the impurities and thereby move the impurity layer boundary into alignment with the second boundary.

8. The process of claim 4, wherein a thin layer of impurities is formed on the substrate by ion implantation, then the substrate is heated for a sufficient time to diffuse the impurities and thereby move the impurity layer boundary into alignment with the second boundary.

9. The process of claim 4, wherein impurities are driven into the substrate of diffusion, and for a sufficient time to form the impurity region boundary aligned with the first boundary.

10. The process of claim 1 wherein the composite further comprises a layer of oxide intermediate the substrate and the silicon layer and wherein after forming the silicon electrode the oxide is formed to have a boundary within the first boundary.

11. The process of claim 10 wherein the oxide is formed by applying a liquid bath etchant to the oxide layer in the presence of the mask and for a sufficient time to overetch the oxide layer beneath the mask.

12. The process of claim 10 wherein a thin layer of impurities is formed on the substrate by ion implantation, then the substrate is heated for a sufficient time to diffuse the impurities and thereby move the impurity layer boundary into alignment with the second boundary.

13. In a process for forming a semiconductor device having a silicon electrode intermediate diffused source and drain regions, from a composite comprising a semiconductor substrate having a layer of silicon thereon, the improvement wherein the boundaries of the silicon electrode are formed coincident with the nearest adjacent source and drain boundaries and comprising:
   forming on the silicon layer a masking layer having a first peripheral boundary;
   forming the silicon electrode having a second peripheral boundary and opposite edges thereof within the first boundary;
   forming layers of impurities at the substrate surface on opposite sides of the silicon electrode, each layer having a boundary coincident with the first peripheral boundary; and
   heating the substrate for a sufficient time to laterally diffuse the impurities such that the boundaries of the impurity layers are coincident with the opposite edges of the second peripheral boundary.

14. The process of claim 13 wherein the composite further comprises a layer of oxide intermediate the substrate and the silicon layer, the oxide layer being removed having opposite boundaries within the first peripheral boundary by etching the oxide layer in the presence of the masking layer subsequent to forming the silicon electrode.

15. The process of claim 14 wherein the impurity layers are formed by ion implantation.

16. The process of claim 13 wherein the composite further comprises a layer of oxide intermediate the substrate and the silicon layer and wherein:
   the oxide layer is formed to a second masking layer having opposite boundaries coincident with the first peripheral boundary; and further comprising
   removing the masking layer subsequent to formation of the second masking layer; and
   forming the layers of impurities such that the boundaries thereof are coincident with the opposite boundaries of the second masking layer.

17. The process of claim 13 wherein the composite further comprises a layer of oxide intermediate the substrate and the silicon layer and wherein the oxide layer is formed to a second masking layer having a boundary coincident with the first peripheral boundary by applying a field-aided plasma etchant to the oxide layer in the presence of the masking layer to remove the portion of the oxide layer outside the first peripheral boundary.

18. The process of claim 17 wherein the step of forming the impurity layers comprises diffusing impurities in the presence of the second masking layer to form the impurity layers on opposite sides of the second masking layer.

19. The process of claim 17 wherein the step of forming the impurity layers comprises implanting impurities in the substrate in the presence of the second masking layer and outside the boundary thereof.

20. The process of claim 13 wherein the composite further comprises a layer of oxide intermediate the substrate and the silicon layer and wherein the oxide layer is formed to a second masking layer having opposite boundaries coincident with the first peripheral boundary by ion milling the oxide layer in the presence of the masking layer to remove the portion of the oxide layer outside the first peripheral boundary.

21. The process of claim 20 wherein the step of forming the impurity layers comprises diffusing impurities in the presence of the second masking layer to form the impurity layers on opposite sides of the second masking layer.

22. The process of claim 20 wherein the impurity layers are formed by implanting impurities in the substrate in the presence of the second masking layer and outside the peripheral boundary thereof.

23. In a process for forming on a semiconductor substrate having a layer of silicon thereon a semiconductor device comprising a silicon electrode adjacent an impurity region, the improvement wherein the boundary of the silicon electrode is formed coincident with the boundary of the impurity region by the process of forming the impurity region, and comprising:

forming on the silicon layer a masking layer having a first boundary;

etching the silicon layer beneath the mask to form the silicon electrode having a second boundary spaced from the first boundary beneath the masking layer; and forming the impurity region in the substrate by depositing by one of diffusion or implantation a layer of impurities having a third boundary coincident with the first boundary and by heating the substrate to drive the impurities into the substrate to bring the third boundary into coincidence with the second boundary.

24. In a process for forming a silicon electrode adjacent a substrate impurity region in a composite comprising a semiconductor substrate, a layer of silicon and an interposed layer of oxide, the improvement wherein the boundary of the silicon electrode is formed coincident with the boundary of the impurity region by the proces of forming the impurity region, and comprising:

forming a masking layer on the silicon layer having a peripheral boundary and having one edge thereof located at a predetermined position along the silicon layer and substrate;

etching the silicon layer in the presence of the masking layer to form a silicon electrode having an edge boundary spaced from the masking layer peripheral boundary and beneath the masking layer;

forming the oxide layer in the presence of the masking layer by one of (a) field-aided plasma etching, or (b) ion milling to form a second, oxide masking layer having an edge boundary coincident with the edge boundary of the masking layer;

depositing, in the substrate in the presence of the second masking layer and by one of diffusion or implantation, a layer of impurities having an edge boundary determined by the edge boundary of the masking layer; and heating the substrate to diffuse the impurities and thereby drive the edge boundary of the impurity layer into coincidence with the edge boundary of the silicon electrode.

25. The process of claim 24 wherein the oxide layer is formed by ion milling to the second, oxide masking layer having an edge boundary coincident with the edge boundary of the masking layer.

26. The process of claim 25 wherein the layer of impurities is deposited by diffusion.

27. The process of claim 25 wherein the layer of impurities is deposited by ion implantation.

28. In a process for forming a silicon electrode adjacent a substrate impurity region in a composite comprising a semiconductor substrate, a layer of silicon and an interposed layer of oxide, the improvement wherein the boundary of the silicon electrode is formed coincident with the boundary of the impurity region by the process of forming the impurity region, and comprising:

forming a masking layer on the silicon layer having a peripheral boundary and having one edge thereof located at a predetermined position along the silicon layer and substrate;

etching the silicon layer in the presence of the masking layer to form a silicon electrode having an edge boundary located within the masking layer peripheral boundary along the substrate;

forming the oxide layer in the presence of the masking layer by liquid bath etching to form a second, oxide masking layer having an edge boundary within the peripheral boundary of the masking layer;

depositing, in the substrate in the presence of the second masking layer by ion implantation, a layer of impurities having the edge boundary coincident with the edge boundary of the masking layer; and heating the substrate to diffuse the impurities and thereby drive the edge boundary of the impurity layer into coincidence with the edge boundary of the silicon electrode.

29. The process of claim 28 wherein the layer of impurities is deposited by diffusion.

30. The process of claim 28 wherein:

the oxide layer is formed by liquid bath etching to the second, oxide masking layer having an edge boundary within the peripheral boundary of the masking layer; and wherein the layer of impurities is deposited in the presence of the masking layer by ion implantation.

31. An improved process for forming a semiconductor device having a gate structure intermediate a source and a drain of junction depth $x_j$, the improvement wherein the gate structure is formed coincident with the source and drain by the process of forming the source and drain, comprising:

forming, in order, silicon oxide and silicon layers on a semiconductor body;

forming a mask structure on the silicon layer having a first peripheral boundary, opposite sides of the boundary being within source and drain regions of the substrate;

etching the silicon layer in the presence of the mask structure to undercut the silicon layer beneath the mask and form a silicon gate electrode having a second peripheral boundary having opposite sides coincident respectively with inner sides of the source and drain regions, and leaving the mask structure extending past the opposite sides of the silicon gate electrode approximately the distance $x_j$;

removing the silicon oxide layer outside the mask boundary by one of (a) plasma etching, or (b) ion milling to form an oxide masking layer having opposite sides thereof coincident with the opposite sides of the mask structure;

depositing impurities at the surface of the substrate in the presence of the oxide masking layer by one of diffusion or ion implantation to form impurity layers such that each impurity layer has an inner side coinciding with one of the opposite sides of the oxide masking layer;

heating the substrate for sufficient time to diffuse the impurities the distance $x_j$ into the substrate and thereby drive the inner sides of the impurity layers across the source and drain regions and into coincidence with the respctive sides of the silicon gate electrode; and attaching electrical contacts to the gate, source and drain.

32. The process of claim 31, wherein the step of depositing impurities is by diffusion, and the depositing and heating steps are done simultaneously.

33. An improved process for forming a semiconductor device having a gate structure intermediate a source and a drain of junction depth $x_j$, the improvement wherein the gate structure is formed coincident with the source and drain by the process of forming the source and drain, comprising:

forming, in order, silicon oxide and silicon layers on a semiconductor body;

forming a mask structure on the silicon layer having a first peripheral boundary, opposite sides of the boundary being within source and drain regions of the substrate;

etching the silicon layer in the presence of the mask structure to undercut the silicon layer beneath the mask and form a silicon gate electrode having a second peripheral boundary having opposite sides coincident with inner sides of the source and drain regions, and leaving the mask structure extending $x_j$ past the opposite sides of the silicon gate electrode;

etching the oxide layer in the presence of the mask structure to remove the oxide outside the mask structure and undercut the oxide layer beneath the mask and form opposite side boundaries in the oxide beneath the mask structure;

depositing ions at the surface of the substrate in the presence of the mask structure by ion implantation to form impurity layers such that each impurity layer has an inner side coinciding with one of the opposite sides of the mask structure;

heating the substrate for sufficient time to diffuse the ions the distance $x_j$ into the substrate and thereby drive the inner sides of the impurity layers across the source and drain regions and into coincidence with the respective opposite sides of the silicon gate electrode; and attaching electrical contacts to the gate, source and drain.

* * * * *

UNITED STATES PATENT AND TRADEMARK OFFICE
CERTIFICATE OF CORRECTION

PATENT NO. : 4,182,023
DATED : January 8, 1980
INVENTOR(S) : Jerome Cohen et al

It is certified that error appears in the above–identified patent and that said Letters Patent are hereby corrected as shown below:

Column 14, Claim 14, lines 11-12, delete "removed" and insert -- formed --.

Signed and Sealed this

Fifteenth Day of April 1980

[SEAL]

Attest:

SIDNEY A. DIAMOND

Attesting Officer

Commissioner of Patents and Trademarks